ELECTRICAL PULSE SHAPING AND AMPLIFYING CIRCUIT

Filed Aug. 20, 1956

INVENTOR.
ROBERT S. PRESCOTT
BY Henry L. Hanson
ATTORNEY 2,952,772
Patented Sept. 13, 1960

2,952,772

ELECTRICAL PULSE SHAPING AND AMPLIFYING CIRCUIT

Robert S. Prescott, Lexington, Mass., assignor, by mesne assignments, to Minneapolis-Honeywell Regulator Company, a corporation of Delaware Filed Aug. 20, 1956, Ser. No. 604,948

6 Claims. (Cl. 250—27)

A general object of the present invention is to provide a new and improved apparatus for reproducing an electrical pulse of preselected characteristics. More specifically, the present invention is concerned with an improved apparatus for reproducing an electrical input pulse where the circuit is characterized by its ability to convert a pulse of short time duration into an output pulse of a substantially increased time duration with the output pulse duration being closely controlled.

In accordance with the principles of the present invention, a pulse of short time duration is applied to the input of a pulse reproduction amplifier and the time duration of the output pulse is determined by the characteristics of the circuit. In circuits of the general type used in the prior art, the time constants have been determined by the magnetic properties of an associated output coupling transformer as well as the amplitudes of the output voltages from an associated amplifying device. In production quantities and commercial use, it is particularly difficult to control circuit parameters such as circuit amplification and the magnetic properties of coupling transformers which affect the time constants of the circuit. In order to achieve a commercially practical circuit having accurate control of the output pulse time duration, it is essential to provide a timing circuit which is capable of producing an accurate output pulse and which does not rely on transformer parameters and circuit amplification for accuracy.

This has been achieved in the present invention by the incorporation of a novel feedback circuit from an output coupling transformer in the form of a special pulse gating circuit which, upon the occurrence of a feedback pulse, will act regeneratively on the associated amplifier device and produce an output pulse whose time duration is dependent solely upon the time constants of the circuit elements on the input of the gating circuit.

It is accordingly a more specific object of the present invention to provide a new and improved pulse reproducing circuit incorporating an output transformer in a feedback circuit connected to a gating or switching circuit wherein the gating circuit incorporates a time delay circuit on the input thereof to establish the output pulse time duration.

In the event that the supply voltages for use with this circuit are subject to variation it is possible to minimize the effects of circuit voltage changes and to achieve the desired control of the output pulse duration by a novel arrangement whereby the voltages associated with the timing and gating or switching circuits are derived directly from the amplifier circuit in a self-compensating manner.

It is therefore a further more specific object of the present invention to provide an improved pulse reproducing circuit wherein the circuit incorporates a gating or switching circuit whose operating potentials are derived from associated amplifier circuits so that variations in the amplitude will not affect the time duration of the output pulse in the circuit.

The various features of novelty which characterize the invention are pointed out with particularity in the claims annexed to and forming a part of the specification. For a better understanding of the invention, its advantages, and specific objects attained with its use, reference should be had to the accompanying drawings and descriptive matter in which there is illustrated and described a preferred embodiment of the invention.

Figures 1, 2:
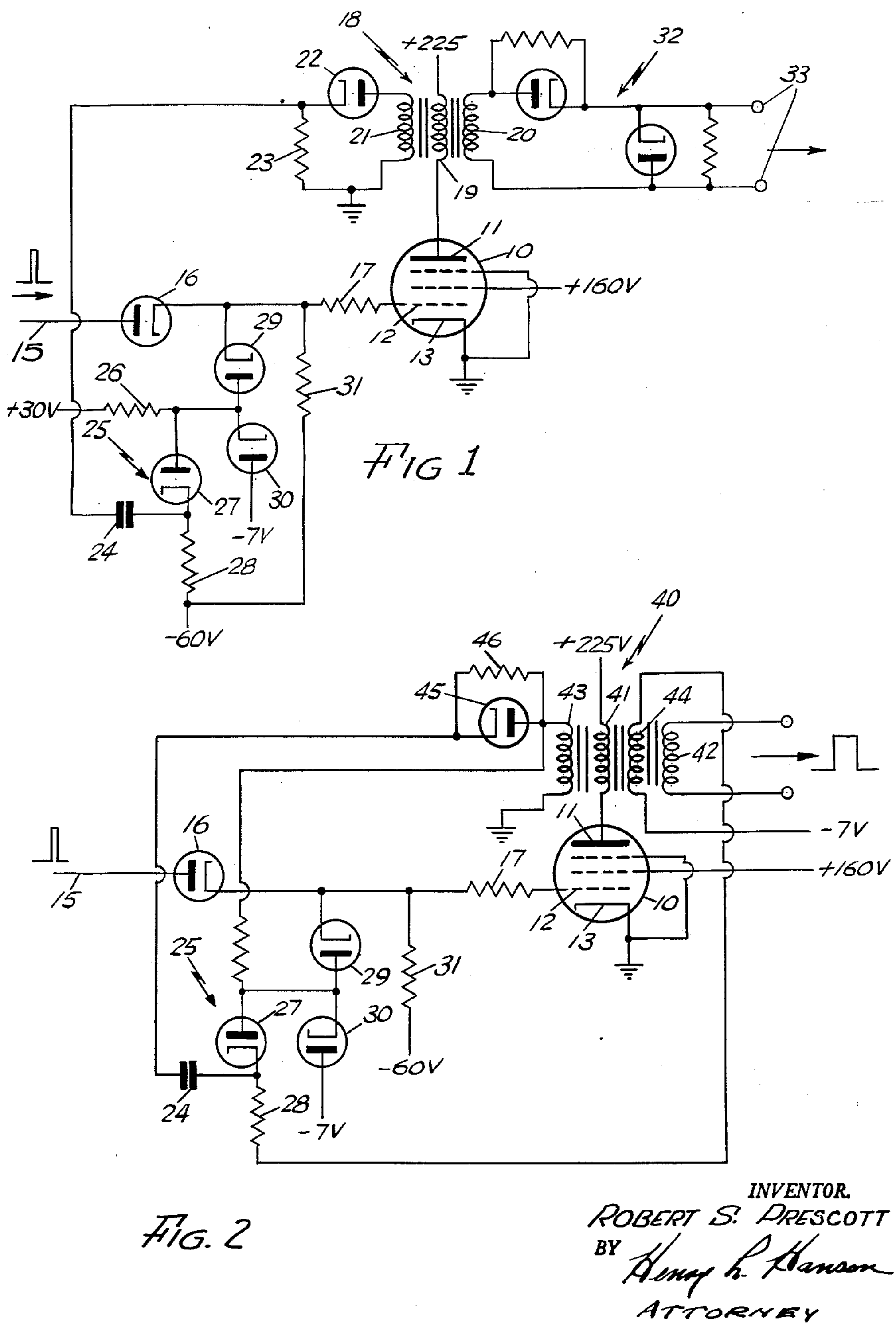
Figure 1 is a schematic showing of one form of the invention.
Figure 2 is a modified form of the circuit shown in Figure 1 incorporating circuit features which eliminate the effects of supply voltage variations.

Referring to Figure 1, the numeral 10 represents an amplifying device shown in the drawing as a pentode having an anode 11, a control electrode 12, cathode 13, as well as a conventional screen electrode and suppressor electrode. Connected to the input control electrode 12 is an input line 15 on which appears the input pulses which are to be reproduced on the output of the amplifier 10. Input line 15 is coupled to the control electrode 12 by way of a coupling diode 16 and a parasitic oscillation suppression resistor 17.

Connected to the anode of the device 10 is a transformer 18 having a primary 19, an output secondary winding 20 and a feedback winding 21. Feedback winding 21 has connected thereacross a diode 22 and a resistor 23. The upper end of the resistor 23 is also coupled by way of a condenser 24 to a gating or switching circuit 25. The gating circuit 25 may be referred to as an "OR" gate or diode switching circuit which comprises a resistor 26, diode 27, and a resistor 28 all connected in series between a plus 30 volt power supply terminal and a minus 60 volt power supply terminal. The junction between the resistor 26 and the diode 27 is connected to a junction between a pair of diodes 29 and 30. A resistor 31 connects the control electrode 12 to a negative source establishing the bias potential to the value established by the potential at the anode of diode 30. The values of the potentials at the sources shown in the drawing are merely illustrative and may assume other values.

The output secondary winding 20 is coupled by a suitable clipping and clamping circuit 32 to a pair of output terminals 33.

In considering the operation of the apparatus shown in Figure 1, it should first be understood that it is intended that the circuit receive on the input line thereof at 15 a pulse which is to be amplified and reproduced in such a manner that the time length of the pulse will be greater than the time length of the input pulse.

Before an input pulse is received on the input line 15, it will be noted that the amplifying device 10 will be cut off or non-conducting. The device 10 will be biased to be non-conductive by the network comprising resistor 31 connected in series with the minus 7 volt terminal, diodes 29 and 30 and the minus 60 volt terminal. With the tube 10 cut off, there will be no signal induced in either of the secondary windings 20 or 21.

While the circuit is in the quiescent state, the gating circuit 25 will be passing current from the plus 30 volt terminal through the resistor 26, diode 27, and resistor 28 to the negative 60 volt supply terminal. There will also be some current flowing from the minus 7 volt power supply terminal through the diode 30 and diode 27, and resistor 28 to the minus 60 volt power supply terminal. These current flows will not effect any current flow in the amplifying device 10 and the device will remain cut off.

As soon as an input pulse is received on the input line 15, this pulse will be passed through the diode 16 and resistor 17 to the control electrode 12. The pulse will raise the potential of the control electrode 12 so that the device 10 will be conductive and a pulse will appear on the primary winding 19 of the transformer 18. The pulse will also appear in the feedback secondary winding 21 so that there will be produced across the resistor 23 a voltage which is positive at the upper terminal of the resistor and negative at the lower terminal. The positive signal is passed directly through the feedback condenser 24 to the junction between the diode 27 and the resistor 28. The appearance of a positive voltage at this point will render the diode 27 nonconductive. With the gate diode 27 closed, the current will no longer flow through the diode 27 but will instead flow through another path which may be traced from the plus 30 volt power supply terminal through the resistor 26, diode 29, resistor 31 to the minus 60 volt power supply terminal. The current flow through the resistor 31 will result in there appearing on the control electrode 12 a voltage which is positive with respect to ground and which will hold the control electrode 12 of the device 10 in the conductive state.

At the first instant that a voltage appeared across the resistor 23, this voltage was reflected directly to the junction between the diode 27 and the resistor 28. This is due to the fact that no suddent change of potential will occur across the condenser 24. However, the condenser 24 will begin to increase its charge by way of resistor 28. This charging of the condenser will continue until the positive potential reflected from the resistor 23 is no longer effective to close the current path through the diode 27. As soon as the diode 27 again becomes conductive, the current from the plus 30 volt terminal will no longer be effective to maintain the control electrode 12 in the tube conductive region and the potential of the control electrode will be restored to quiescent bias potential thus switching the tube to the nonconductive state.

Following the main pulse, the condenser 24 will discharge by way of the resistor 23, ground, the minus 7 volt source, and diodes 30 and 27.

The time that it takes to switch from the start of the conductive state back to the nonconductive state is a function of the time constant formed by the resistor 28 and the condenser 24. In one preferred embodiment of the invention the input pulse was 0.2 microsecond and the output pulse appearing on the output terminal 33 could be variably adjusted between 8 and 25 microseconds depending upon the size of the resistor 28 and the condenser 24. In this particular form of the invention, the transformer 18 should be designed so that it does not saturate at any time during the time that the pulse is being reproduced. In this way, it is possible to avoid having the magnetic properties of the transformer reflected into the time constant of the circuit and consequently the only parameters which appreciably affect the time constant are the resistor 28 and the condenser 24.

Referring now to Figure 2, the basic amplifier and reproducing circuitry is the same as that shown in Figure 1 and corresponding components carry corresponding reference characters.

Added to the circuit of Figure 2 is a transformer 40 having a primary winding 41, an output winding 42, a feedback winding 43 and a voltage supply winding 44. The winding 43 is connected to a diode 45 having a resistor 46 connected in parallel therewith.

The circuit of Figure 2 has been designed to operate in a manner which will eliminate the effects of power supply changes on the gating circuit 25. Thus, in Figure 1, if the supply voltage source supplying the plus 30 volt and minus 60 volt voltages is not regulated, the time duration of the output pulse on the output terminal 33 will vary in accordance with the voltage variations. In many instances, the voltage available is closely regulated and the circuitry of Figure 2 is not required. However, in those cases where the supply voltages are not closely regulated, the circuit of Figure 2 has been found to operate with a high degree of accuracy. In this instance, the supply voltages for the gate 25 are derived directly from the transformer 40. Thus the resistor 26 at its upper terminal is connected to the upper terminal of the secondary winding 43. This will supply the positive voltage required on the upper terminal of the resistor 26. The lower terminal of the resistor 28 is connected to the secondary winding 44, said winding having thereon a negative voltage when there is a pulse being amplified by the amplifying device 10. If there is a tendency for the output voltage amplitude to vary, the voltage variations are reflected to both sides of the gating circuit 25 and consequently, the variations cancel.

Considering the operation of Figure 2 more specifically, in the absence of an input pulse, the device 10 will be biased to cut off because the control electrode thereof is connected to the resistor 31, the upper terminal of which is held at approximately minus 7 volts by the diodes 29 and 30.

As soon as an input pulse is received on the input line 15, this pulse will be transferred through the diode 16 and resistor 17 to the control electrode 12 of device 10 to thereby render the device 10 conducting. The turning on of the current flow through the device 10 will induce a voltage into the secondary winding 43 which will be fed back by way of the parallel circuit formed on the diode 45 and resistor 46 and the condenser 24 to the junction point between the diode 27 and the resistor 28. The application of a positive potential to the diode 27 on the cathode side thereof will cut this diode off so that no current can flow therethrough. With the diode 27 cut off, the current in the gating circuit will flow from the positive terminal of the secondary 43 through the resistor 26, diode 29, and resistor 31 to the minus 60 volt power supply terminal. This will result in the application of a positive feed back potential to the control electrode 12 which in turn will maintain the device 10 in a conductive state. Simultaneously the lower end of resistor 28 is driven negative by virtue of the potential generated in secondary 44 and the condenser 24 commences to charge. As soon as the condenser 24 charges sufficiently by way of resistor 28, the diode 27 will again become conductive and the current flow through the resistor 31, which originated from the secondary 43, will be cut off and the control electrode 12 will be pulled back down to cut off or to a potential of approximately a minus 7 volts as clamped thereby due to the action of the diodes 29 and 30. The circuit will remain cut off until a further pulse is received on the input line 15. Following the main pulse, the condenser 24 will discharge to its quiescent state by way of resistor 46, ground, the minus 7 volt source, and diodes 30 and 27.

Inasmuch as the voltages for the gate 25 are derived from the secondary windings 43 and 44, it will be apparent that variations in these voltages will tend to cancel out on the gating circuit and the timing effected by the resistor 28 and condenser 24 will not be appreciably altered. As with the circuit shown in Figure 1, the time constant of the circuit is based upon the time constant of the condenser 24 and resistor 28 and is substantially independent of the other circuit parameters such as the magnetic characteristics of the transformer 40.

While, in accordance with the provisions of the statutes, there has been illustrated and described the best forms of the invention known, it will be apparent to those skilled in the art that changes may be made in the form of the apparatus disclosed without departing from the spirit of the invention as set forth in the appended claims, and that in some cases, certain features of the invention may be used to advantage without a corresponding use of other features.

What is claimed is:

1. An electrical pulse reproducing circuit comprising a single electrical amplifying device having an input and an output, a transformer having a primary winding connected to said output and a secondary winding connected to a regenerative feedback circuit, a biasing circuit connected to said input to maintain said amplifying device in a first operative state, a signal switching circuit connected to said input to override said bias circuit upon the application of a signal to said switching circuit, a regenerative connection between said feedback circuit and the input of said switching circuit to supply a signal to said switching circuit substantially immediately upon the occurrence of a signal on the input of said amplifying device to change the operating state of said device to a second operative state, and a timing circuit directly connected to said feedback circuit and to the input of said switching circuit to control the time that the signal from said regenerative circuit on said switching circuit will override said bias circuit.

2. An electrical pulse reproducing circuit comprising an electrical amplifying device having an input and an output, a transformer having a primary winding connected to said output and a secondary winding connected to a regenerative feedback circuit, a biasing circuit connected to said input to maintain said amplifying device in a first operative state, a switching circuit connected to said input to override said bias circuit upon the application of a signal to said switching circuit, a regenerative connection between said secondary winding and the input of said switching circuit to supply a signal to said switching circuit substantially immediately upon the occurrence of a signal on the input of said amplifying device to change the operating state of said device to a second operative state, and a timing circuit directly connected to said feedback circuit and to the input of said switching circuit to control the time that said switching circuit will override said bias circuit, said timing circuit comprising a resistor and a condenser connected in series.

3. An electrical pulse reproducing circuit comprising an electrical amplifying device having an input and an output, a transformer having a primary winding connected to said output and a secondary winding, a biasing circuit connected to said input to maintain said amplifying device in a first operative state, a diode switching circut connected to said input to override said bias circuit upon the application of a signal to said switching circuit, a regenerative feedback connection between said secondary winding and the input of said switching circuit to supply a signal to said switching circuit substantially immediately upon the occurrence of a signal on the input of said amplifying device to change the operating state of said device to a second operative state, and a timing circuit directly connected to the input of said switching circuit and to said feedback to control the time that said switching circuit will override said bias circuit.

4. An electrical pulse reproducing circuit comprising a single electrical amplifier device having an input and an output, a transformer connected to said output and having a secondary winding, a regenerative feedback circuit connected from said secondary winding to said input, said feedback circuit comprising a diode switching circuit having a positive potential source connected to one terminal thereof and a negative potential source connected to a second terminal thereof, a resistor and a condenser connected to the input of said switching circuit to connect the feedback signal substantially immediately to said switching circuit and to determine the time a feedback signal will be effective in said switching circuit, and biasing means connected to said device input to normally maintain said amplifier device in a fixed state in the absence of an input signal and a feedback signal.

5. An electrical pulse reproducing circuit comprising a single electrical amplifier device having an input and an output, a transformer connected to said output and having a pair of secondary windings, a regenerative feedback circuit connected from one of said secondary windings to said input, said feedback circuit comprising a diode switching circuit having a positive potential terminal connected to said one secondary winding and a negative potential terminal connected to the other of said secondary windings, a resistor and a condenser connected to the input of said switching circuit to connect the regenerative feedback signal substantially immediately to said switching circuit and to determine the time the regenerative feedback signal will be effective in said switching circuit, and biasing means connected to said device input to normally maintain said amplifier device in a fixed state in the absence of an input signal and a feedback signal.

6. An electrical pulse reproducing circuit comprising a single electrical amplifier device having an input and an output, a transformer connected to said output and having a plurality of secondary windings, a regenerative feedback circuit from one of said secondary windings to said input, said feedback circuit comprising a diode switching circuit having a positive potential terminal connected to one terminal of one of said secondary windings and a negative potential terminal connected to another of said secondary windings, a resistor and a condenser connected to the input of said switching circuit to connect the feedback signal substantially immediately to the input of said switching circuit and to determine the time the regenerative feedback signal will be effective in said switching circuit, and biasing means connected to said device input to normally maintain said amplifier device in a fixed state in the absence of an input signal or a feedback signal.

References Cited in the file of this patent

UNITED STATES PATENTS

| | | |
|---|---|---|
| 2,465,249 | McClellan | Mar. 22, 1949 |
| 2,639,386 | Karpeles | May 19, 1953 |
| 2,643,330 | Borgeson | June 23, 1953 |
| 2,683,806 | Moody | July 13, 1954 |
| 2,712,065 | Elbourn et al. | June 28, 1955 |
| 2,756,329 | Lubkin | July 24, 1956 |
| 2,758,205 | Lubkin | Aug. 7, 1956 |
| 2,758,208 | Grayson | Aug. 7, 1956 |
| 2,764,688 | Grayson et al. | Sept. 25, 1956 |
| 2,786,137 | Paivinen | Mar. 19, 1957 |
| 2,789,218 | Leonard | Apr. 16, 1957 |